US009972591B2

(12) United States Patent
Harano

(10) Patent No.: US 9,972,591 B2
(45) Date of Patent: May 15, 2018

(54) METHOD OF MANUFACTURING SEMICONDUCTOR DEVICE

(71) Applicant: Renesas Electronics Corporation, Koutou-ku, Tokyo (JP)

(72) Inventor: Hideki Harano, Gunma (JP)

(73) Assignee: Renesas Electronics Corporation, Tokyo (JP)

( * ) Notice: Subject to any disclaimer, the term of this patent is extended or adjusted under 35 U.S.C. 154(b) by 0 days. days.

(21) Appl. No.: 15/419,069

(22) Filed: Jan. 30, 2017

(65) Prior Publication Data

US 2017/0287859 A1 Oct. 5, 2017

(30) Foreign Application Priority Data

Mar. 31, 2016 (JP) .................................. 2016-070283

(51) Int. Cl.
*H01L 21/44* (2006.01)
*H01L 23/00* (2006.01)
(Continued)

(52) U.S. Cl.
CPC ............ *H01L 24/11* (2013.01); *H01L 21/563* (2013.01); *H01L 23/3142* (2013.01); *H01L 2224/0345* (2013.01); *H01L 2224/03462* (2013.01); *H01L 2224/03464* (2013.01); *H01L 2224/0401* (2013.01); *H01L 2224/05083* (2013.01); *H01L 2224/05124* (2013.01); *H01L 2224/05144* (2013.01); *H01L 2224/05147* (2013.01); *H01L 2224/05155* (2013.01); *H01L 2224/05166* (2013.01); *H01L 2224/11334* (2013.01); *H01L 2224/11849* (2013.01); *H01L 2224/13006* (2013.01); *H01L 2224/13014* (2013.01); *H01L 2224/13016* (2013.01); *H01L 2224/13022* (2013.01); *H01L 2224/13023* (2013.01);
(Continued)

(58) Field of Classification Search
CPC .............................. H01L 24/11; H01L 21/563
See application file for complete search history.

(56) References Cited

U.S. PATENT DOCUMENTS 7,227,263 B2 * 6/2007 Yamaguchi ......... H01L 23/3114
257/737
7,611,041 B2 * 11/2009 Tago .................... B23K 3/0623
228/180.22
(Continued)

FOREIGN PATENT DOCUMENTS

JP 2005-044986 A 2/2005
JP 2005-268661 A 9/2005
WO WO 2015/146473 * 10/2015 ........... B23K 35/363

*Primary Examiner* — Jamie C Niesz
(74) *Attorney, Agent, or Firm* — Shapiro, Gabor and Rosenberger, PLLC

(57) ABSTRACT

To improve reliability of a semiconductor device, in a method of manufacturing the semiconductor device, a semiconductor substrate having an insulating film in which an opening that exposes each of a plurality of electrode pads is formed is provided, and a flux member including conductive particles is arranged over each of the electrode pads. Thereafter, a solder ball is arranged over each of the electrode pads via the flux member, and is then heated via the flux member so that the solder ball is bonded to each of the electrode pads. The width of the opening of the insulating film is smaller than the width (diameter) of the solder ball.

10 Claims, 10 Drawing Sheets

(51) Int. Cl.
H01L 23/31 (2006.01)
H01L 21/56 (2006.01)

(52) U.S. Cl.
CPC ............ *H01L 2224/13111* (2013.01); *H01L 2224/13139* (2013.01); *H01L 2224/13147* (2013.01); *H01L 2224/13164* (2013.01); *H01L 2224/14131* (2013.01); *H01L 2224/16113* (2013.01); *H01L 2224/16227* (2013.01); *H01L 2224/32225* (2013.01); *H01L 2224/73204* (2013.01); *H01L 2224/81191* (2013.01); *H01L 2224/81203* (2013.01); *H01L 2224/81815* (2013.01); *H01L 2224/831* (2013.01); *H01L 2224/92125* (2013.01); *H01L 2924/014* (2013.01); *H01L 2924/05042* (2013.01); *H01L 2924/05442* (2013.01); *H01L 2924/07025* (2013.01); *H01L 2924/10253* (2013.01); *H01L 2924/13091* (2013.01); *H01L 2924/15311* (2013.01); *H01L 2924/2075* (2013.01); *H01L 2924/20751* (2013.01)

(56) References Cited

U.S. PATENT DOCUMENTS

| | | | | |
|---|---|---|---|---|
| 2008/0042279 | A1* | 2/2008 | Bang | H01L 21/4853 |
| | | | | 257/738 |
| 2012/0193783 | A1* | 8/2012 | Hong | H01L 23/3128 |
| | | | | 257/737 |
| 2013/0291378 | A1* | 11/2013 | Higashizawa | H05K 13/04 |
| | | | | 29/832 |
| 2014/0183733 | A1* | 7/2014 | Chu | B23K 35/0244 |
| | | | | 257/738 |
| 2017/0190005 | A1* | 7/2017 | Uehata | B23K 35/264 |

* cited by examiner

METHOD OF MANUFACTURING SEMICONDUCTOR DEVICE

CROSS-REFERENCE TO RELATED APPLICATIONS

The disclosure of Japanese Patent Application No. 2016-070283 filed on Mar. 31, 2016 including the specification, drawings and abstract is incorporated herein by reference in its entirety.

BACKGROUND

The present invention relates to a manufacturing technique of a semiconductor device in which a solder ball is formed on a semiconductor chip.

A method of manufacturing a semiconductor device in which a solder ball is formed on a semiconductor chip is described in Japanese Unexamined Patent Application Publication No. 2005-44986, for example. Japanese Unexamined Patent Application Publication No. 2005-44986 discloses a technique that applies flux containing metal minute particles on an individual terminal of a coupling electrode terminal on a wafer, and fixes a solder ball onto the flux.

Further, a manufacturing technique of a semiconductor device that forms a plurality of external terminals by applying flux on a surface of each of a plurality of electrode pads on a semiconductor wafer, thereafter mounting a solder ball on the flux, and further heating the solder ball to melt the solder ball, is disclosed in Japanese Unexamined Patent Application Publication No. 2005-268661, for example.

SUMMARY

With miniaturization of the semiconductor chip or increase of the number of the electrode pads on the semiconductor chip in association with improvement of functions, the size of an opening (the width of the opening) in an insulating film, through which a surface (a face to which the solder ball is bonded) of the electrode pad of the semiconductor chip is exposed, becomes smaller.

As a result, a bonding failure of the solder ball arranged on the electrode pad may occur.

Other problems and novel features will be apparent from the description of the present specification and accompanying drawings.

A method of manufacturing a semiconductor device according to an embodiment includes the steps of: providing a semiconductor substrate including an electrode pad and an insulating film in which an opening that exposes the electrode pad is formed; arranging a flux member having an conductive member over a surface of the electrode pad; arranging a solder ball over the electrode pad via the flux member; and transferring heat from the electrode pad to the solder ball via the conductive member included in the flux member to melt the solder ball, thereby bonding the solder ball to the electrode pad. Further, the width of the opening of the insulating film is smaller than the width of the solder ball.

According to the above embodiment, it is possible to improve reliability of the semiconductor device.

DETAILED DESCRIPTION

Figure 1:
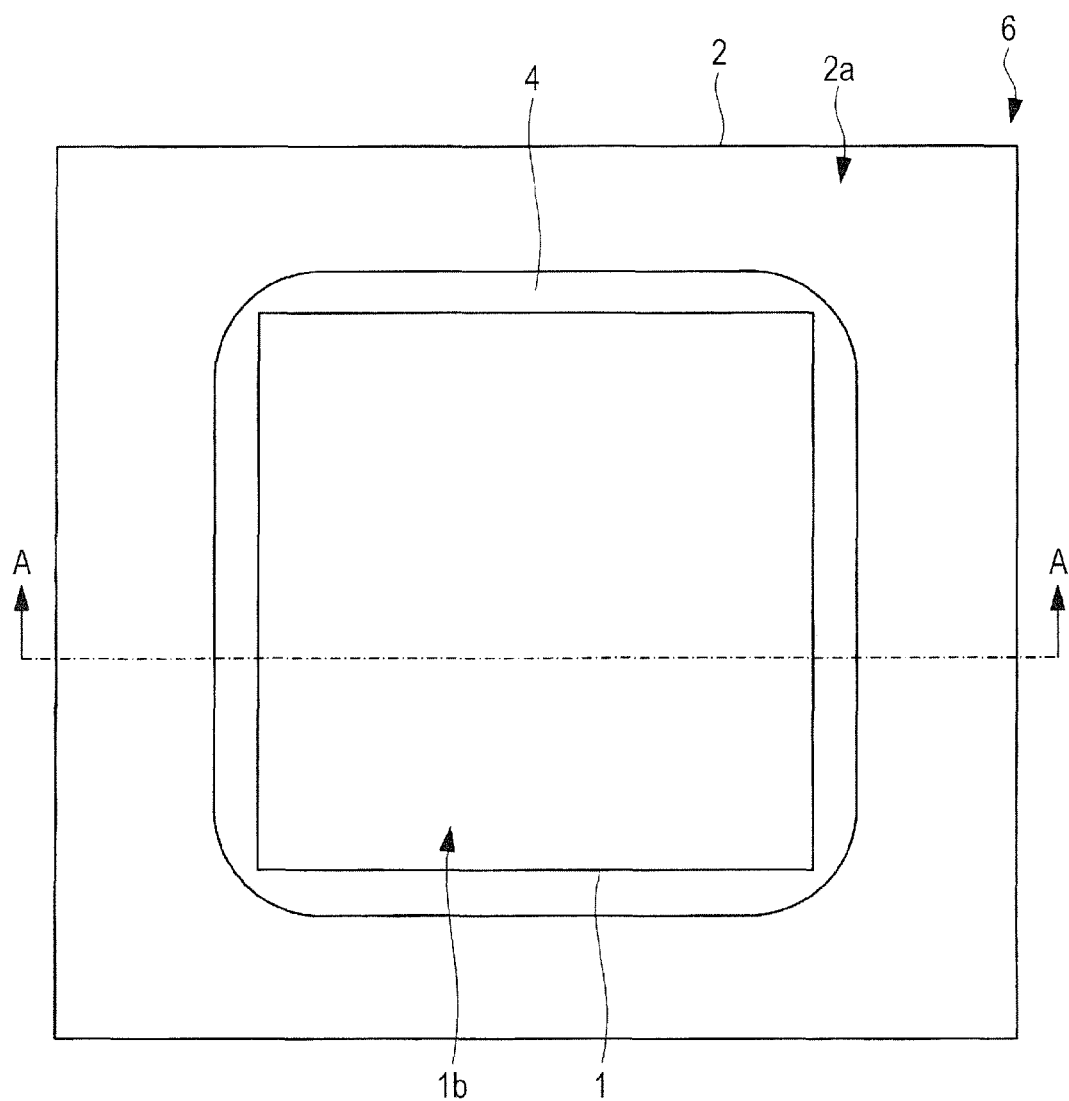
FIG. 1 is a plan view illustrating a structure of a semiconductor device according to an embodiment.

In the following embodiment, the description of the same or a similar portion is not repeated in principle, unless especially necessary.

The following embodiment will be described while being divided into a plurality of sections or embodiments, if necessary for the sake of convenience. However, unless otherwise specified, these are not independent of each other, but are in a relation such that one is a modified example, detailed description, complementary explanation, or the like of a portion or the whole of the other.

Further, in the following embodiment, when a reference is made to the number of elements, and the like (including number, numerical value, quantity, range, and the like), the number of elements is not limited to the specific number, but may be equal to, greater than, or less than the specific number, unless otherwise specified, or except the case where the number is apparently limited to the specific number in principle, or except for other cases.

Furthermore, in the following embodiment, a constitutional element thereof (including an operation step or the like) is not always essential, unless otherwise specified, or except the case where it is apparently considered essential in principle, or except for other cases.

In addition, in the following embodiment, when the description such as "be formed of A", "be formed by A", "include (s) A", and "contain (s) A." is used for a constitutional element or the like, the description is not intended to exclude another element, unless otherwise it is clearly described that only that element is used or except for other cases. Similarly, in the following embodiment, when a reference is made to the shape, positional relationship or the like of the constitutional elements or the like, it is understood that it includes one substantially analogous or similar to the shape or the like, unless otherwise specified, or unless otherwise considered apparently in principle, or except for other cases. This also applies to the aforementioned number and range.

An embodiment of the present invention is described in detail below, referring to the drawings. Throughout the drawings for explaining the embodiment, members having the same function are labeled with the same reference sign, and the redundant description is omitted. Further, hatching is given even in a plan view for making the description easier to understand.

<Semiconductor Device>

Figure 2:
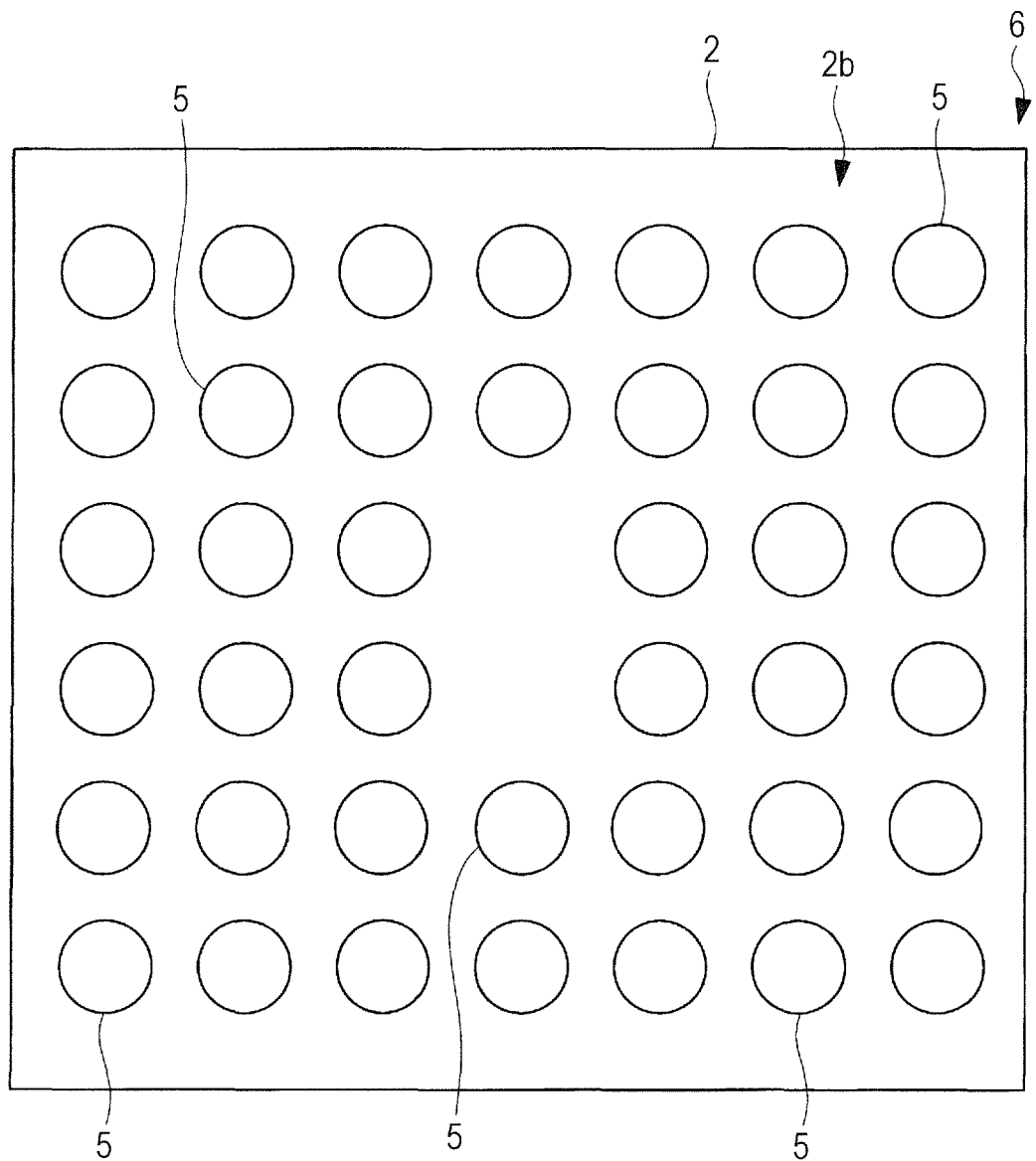
FIG. 2 is a back view illustrating an example of a back side structure of the semiconductor device illustrated in FIG. 1.
Figure 3:
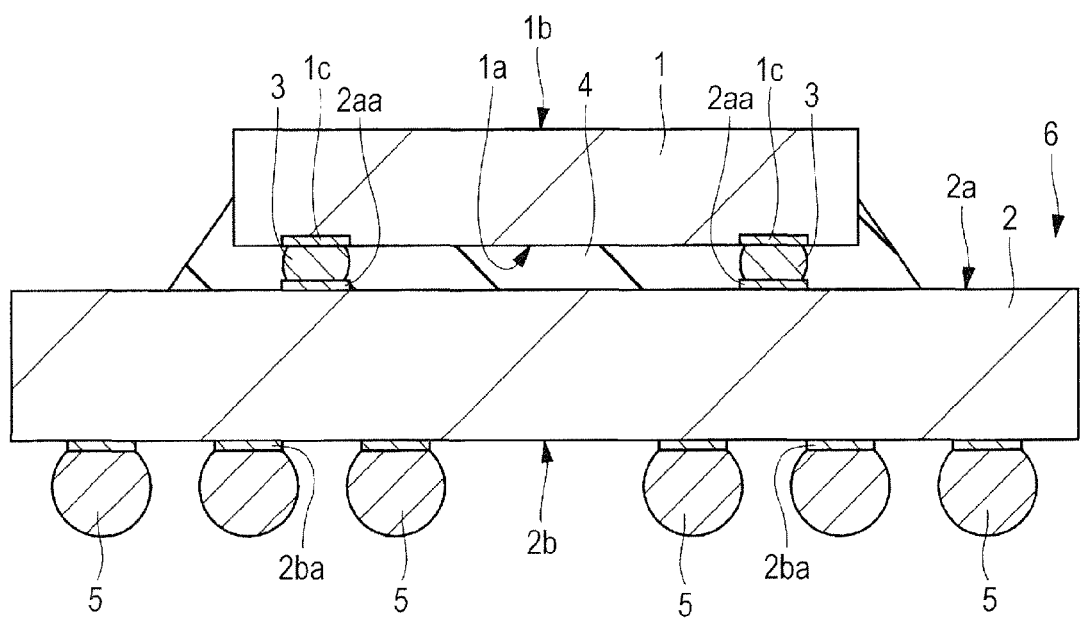
FIG. 3 is a cross-sectional view illustrating a structure, taken along line A-A in FIG. 1.

FIG. 1 is a plan view illustrating an example of a structure of a semiconductor device according to an embodiment. FIG. 2 is a back view illustrating an example of a back side structure of the semiconductor device illustrated in FIG. 1. FIG. 3 is a cross-sectional view illustrating a structure, taken along line A-A in FIG. 1.

The structure of the semiconductor device according to the present embodiment is described, referring to FIGS. 1 to 3.

The semiconductor device according to the present embodiment includes a semiconductor chip 1 and a wiring board 2 as illustrated in FIG. 1. As illustrated in FIG. 3, the semiconductor chip 1 is flip-chip bonded to the wiring board 2. That is, the semiconductor chip 1 is mounted over an upper surface (chip-mounting surface) 2a of the wiring board 2 via a plurality of solder balls 3 in such a manner that its principal surface 1a faces the upper surface 2a of the wiring board 2.

Meanwhile, a plurality of external terminals 5 of the semiconductor device are provided on a lower surface 2b of the wiring board 2. In the semiconductor device of the present embodiment, the external terminals 5 are solder balls (solder members), for example, and are arranged in a grid as illustrated in a plan view of FIG. 2. Therefore, a BGA (Ball Grid Array) 6 is described as an example of the semiconductor device in the present embodiment.

In the BGA 6 of the present embodiment, a plurality of electrode pads 1c exposed in the principal surface 1a of the semiconductor chip 1 and a plurality of terminals (bonding leads) 2aa exposed in the upper surface 2a of the wiring board 2 are electrically coupled to each other via the solder balls 3, respectively. Further, on the lower-surface 2b side of the wiring board 2, the external terminals 5 are provided on a plurality of terminals (lands) 2ba exposed in the lower surface 2b, respectively. With this configuration, the electrode pads 1c of the semiconductor chip 1 and the external terminals 5 corresponding thereto are electrically coupled to each other via the terminals 2aa, the solder balls 3, the terminals 2ba, and a wiring, a via, or a through-hole wiring of the wiring board 2, for example.

In the BGA 6, a gap formed between the semiconductor chip 1 and the wiring board 2 is filled with a sealing member formed of a sealing resin (an underfill resin) 4 on the upper surface 2a side of the wiring board 2. This sealing member 4 is epoxy resin, for example, and is filled for the purpose of ensuring coupling reliability between the semiconductor chip 1 and the wiring board 2.

The sealing member 4 further covers a portion of a side face of the semiconductor chip 1. With this configuration, the sealing member 4 can protect a flip-chip coupling portion (a coupling portion between the solder ball 3 and the terminal 2aa). It is also possible to suppress entrance of moisture into the flip-chip coupling portion from the surroundings of the semiconductor chip 1. However, a back surface 1b of the semiconductor chip 1 is exposed while facing upward in the BGA 6.

<Semiconductor Chip>

Figure 4:
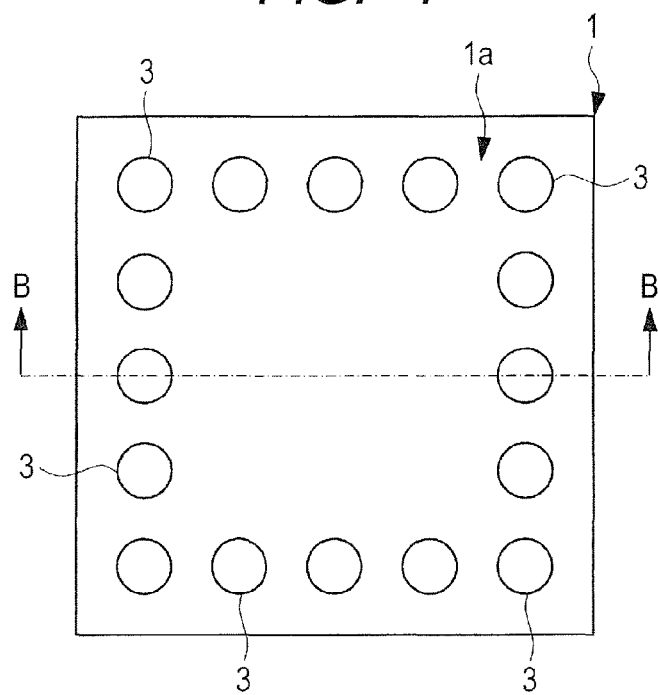
FIG. 4 is a plan view illustrating an example of a principal-surface side structure of a semiconductor chip mounted on the semiconductor device illustrated in FIG. 1.
Figure 5:
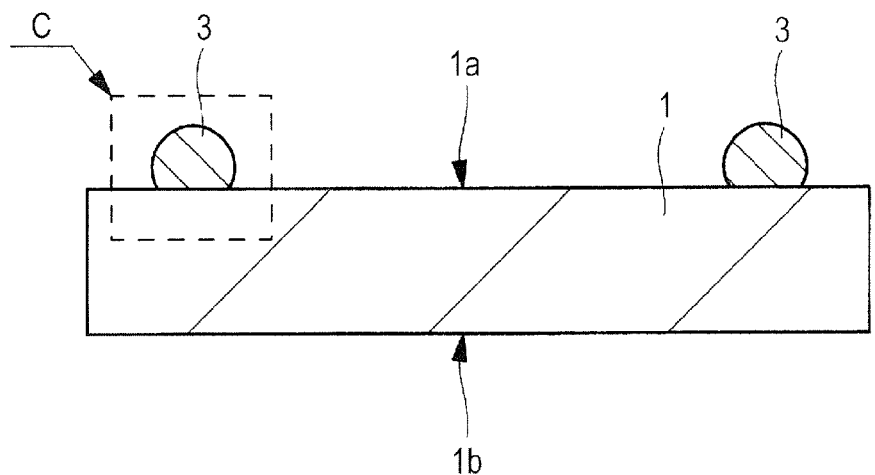
FIG. 5 is a cross-sectional view illustrating a structure, taken along line B-B in FIG. 4.
Figure 6:
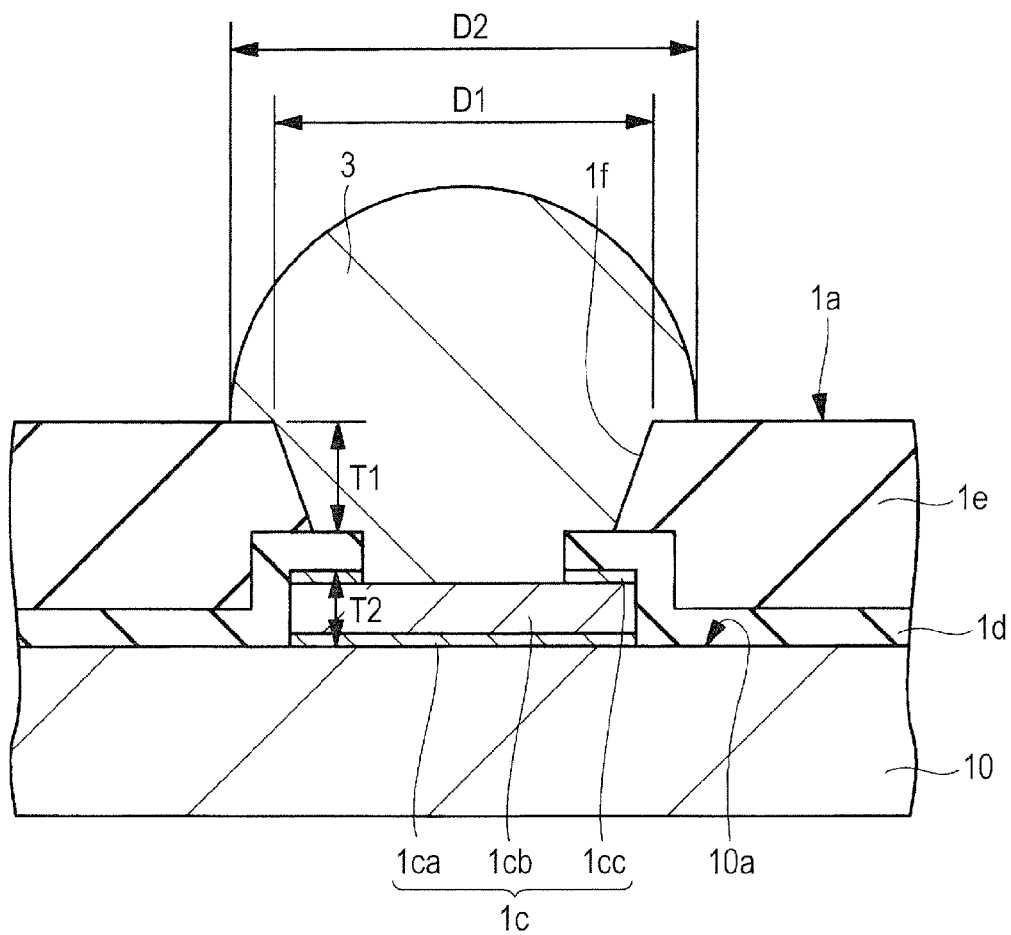
FIG. 6 is an enlarged partial cross-sectional view illustrating a structure of a C portion illustrated in FIG. 5.
Figure 7:
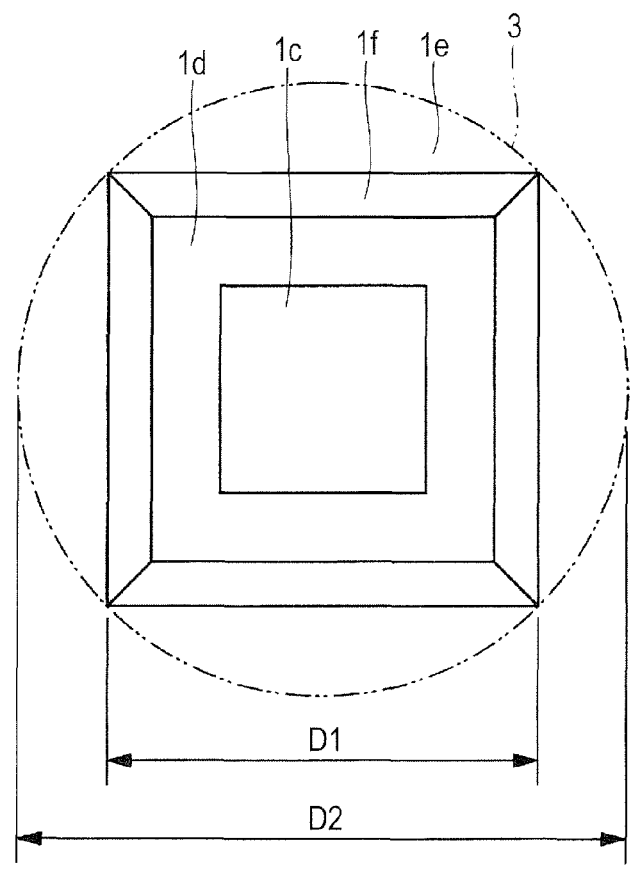
FIG. 7 is a plan view illustrating an example of a structure of an electrode pad illustrated in FIG. 6.

FIG. 4 is a plan view illustrating an example of a principal-surface side structure of a semiconductor chip mounted in the semiconductor device illustrated in FIG. 1. FIG. 5 is a cross-sectional view illustrating a structure, taken along line B-B in FIG. 4. FIG. 6 is an enlarged partial cross-sectional view illustrating a structure of a C portion illustrated in FIG. 5. FIG. 7 is a plan view illustrating an example of a structure of an electrode pad illustrated in FIG. 6.

The semiconductor chip 1 mounted in the BGA 6 of the present embodiment is described.

As illustrated in FIGS. 4 to 7, the semiconductor chip 1 includes a semiconductor substrate 10, the electrode pad 1c formed on an upper surface 10a of the semiconductor substrate 10, and insulating films 1d and 1e that cover a peripheral portion of the electrode pad 1c and also cover the upper surface 10a. The principal surface 1a of the semiconductor chip 1 (see FIG. 3, for example) acquired by separating the semiconductor substrate 10 into pieces is a surface corresponding to the surface of this insulating film 1e. The semiconductor substrate 10 includes a plurality of semiconductor elements each formed by a MISFET (Metal Insulator Semiconductor Field Effect Transistor) formed on an element-forming surface that is not shown, for example, a plurality of wiring layers (a multilayer wiring layer) that electrically couple the semiconductor elements and the electrode pads 1c to each other, respectively, and a plurality of insulating layers each arranged between adjacent ones of the wiring layers. The upper surface 10a of the semiconductor substrate 10 corresponds to a surface of an uppermost one of the insulating layers. The electrode pads 1c are arranged along each side of the principal surface 1a of the semiconductor chip 1. As illustrated in FIGS. 4 and 6, the solder balls 3 made of solder material are coupled to the electrode pads 1c, respectively. These solder balls 3 are protruding electrodes that electrically couple the semiconductor chip 1 and the wiring board 2 to each other.

Each of the electrode pads 1c of the semiconductor chip 1 has a three-layer structure, for example. However, the structure of the electrode pad 1c is not limited to the three-layer structure. In the structure of the electrode pad 1c illustrated in FIG. 6, a lowermost layer 1ca is a titanium layer, an intermediate layer 1cb is an aluminum layer, and an uppermost layer 1cc is a titanium layer, for example.

A surface of each electrode pad 1c is covered in its peripheral portion by the insulating film (a protection film, an inorganic material) 1d that is covered by the insulating film (a protection film, an organic material) 1e. The insulating film 1d is an SiN film or an $SiO_2$ film, for example, while the insulating film 1e is a polyimide film, for example. An opening 1f for mounting the solder ball 3 is formed in the insulating film 1d and the insulating film 1e. In this opening 1f, each solder ball 3 is electrically coupled to the corresponding electrode pad 1d. The shape of the opening 1f in a plan view is square as illustrated in FIG. 7, for example.

In the semiconductor chip 1 of the present embodiment, the width of the opening 1f in the insulating film 1e is smaller than the diameter of the solder ball 3. Specifically, the width D1 of the opening 1f that is square in a plan view is smaller than the width (diameter) D2 of the solder ball 3 (D1<D2), as illustrated in the cross-sectional view of FIG. 6.

Therefore, in the semiconductor chip 1 of the present embodiment, the solder ball 3 covers the opening 1f in the insulating film 1e above each of the electrode pads 1c.

<Method of Manufacturing Semiconductor Device>

1. Provision of Each Member (Wiring Board and Semiconductor Chip)

1-1. Regarding Wiring Board

The wiring board 2 has the upper surface 2a and the lower surface 2b that is a mounting surface opposite to the upper surface 2a or the back surface of the upper surface 2a. A plurality of terminals (bonding leads) 2aa for flip-chip bonding are provided on the upper surface 2a of the wiring board 2. That is, the terminals 2aa on the upper surface 2a of the wiring board 2 are arranged to match the arrangement of the electrode pads 1c of the semiconductor chip 1. This arrangement enables flip-chip bonding.

Meanwhile, the terminals (lands) 2ba on each of which the external terminal 5 is formed are provided on the lower surface 2b of the wiring board 2. The terminals 2ba are arranged in a grid, for example.

Further, a solder-resist film that is an insulating film, not illustrated, is formed on each of the upper surface 2a and lower surface 2b of the wiring board 2. The terminals 2aa are arranged in a plurality of openings in the solder-resist film, respectively, on the upper-surface 2a side. Also on the lower-surface 2b side, the terminals 2ba are arranged in a plurality of openings in the solder-resist film, respectively.

With this configuration, the terminals 2aa on the upper-surface 2a side and the terminals 2ba on the lower-surface 2b side, corresponding to the terminals 2aa, are electrically coupled to each other via internal wiring, through hole wiring, or the like (not illustrated).

1-2. Regarding Semiconductor Chip

Figure 8:
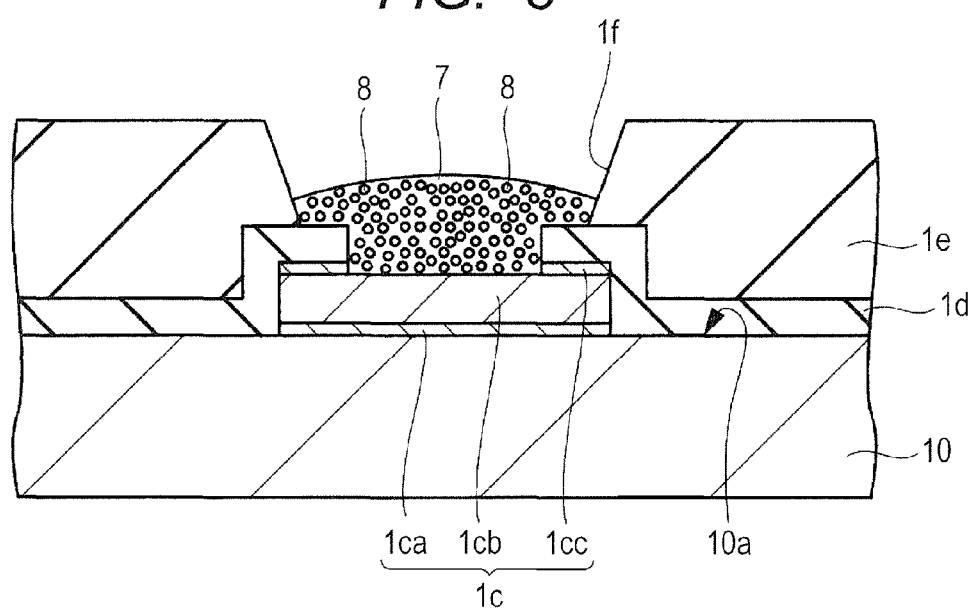
FIG. 8 is an enlarged partial plan view illustrating an example of a state in which a flux member is arranged in manufacturing of the semiconductor chip illustrated in FIG. 4.
Figure 9:
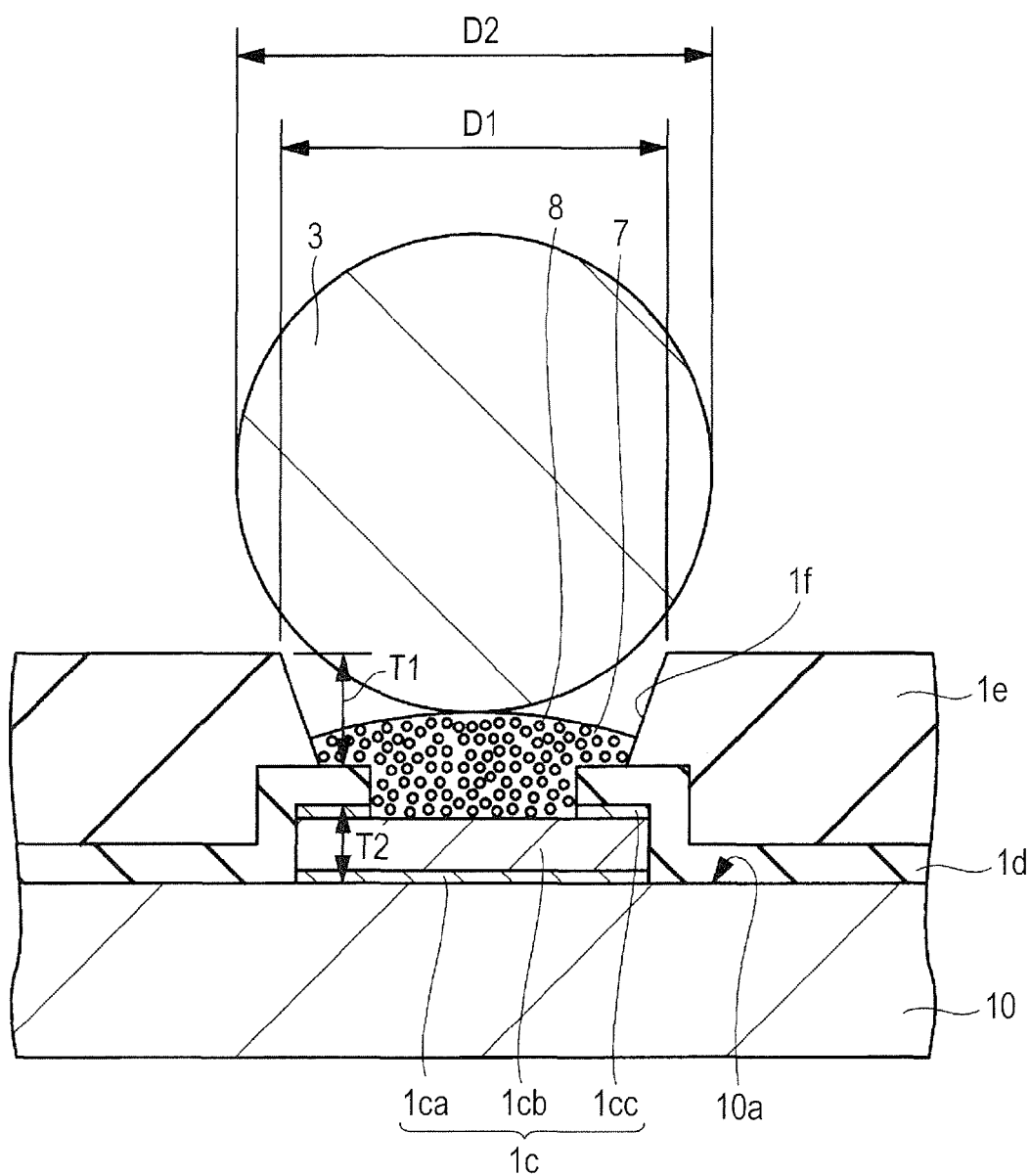
FIG. 9 is an enlarged partial plan view illustrating an example of a state in which a solder ball is arranged in the manufacturing of the semiconductor chip illustrated in FIG. 4.
Figure 10:
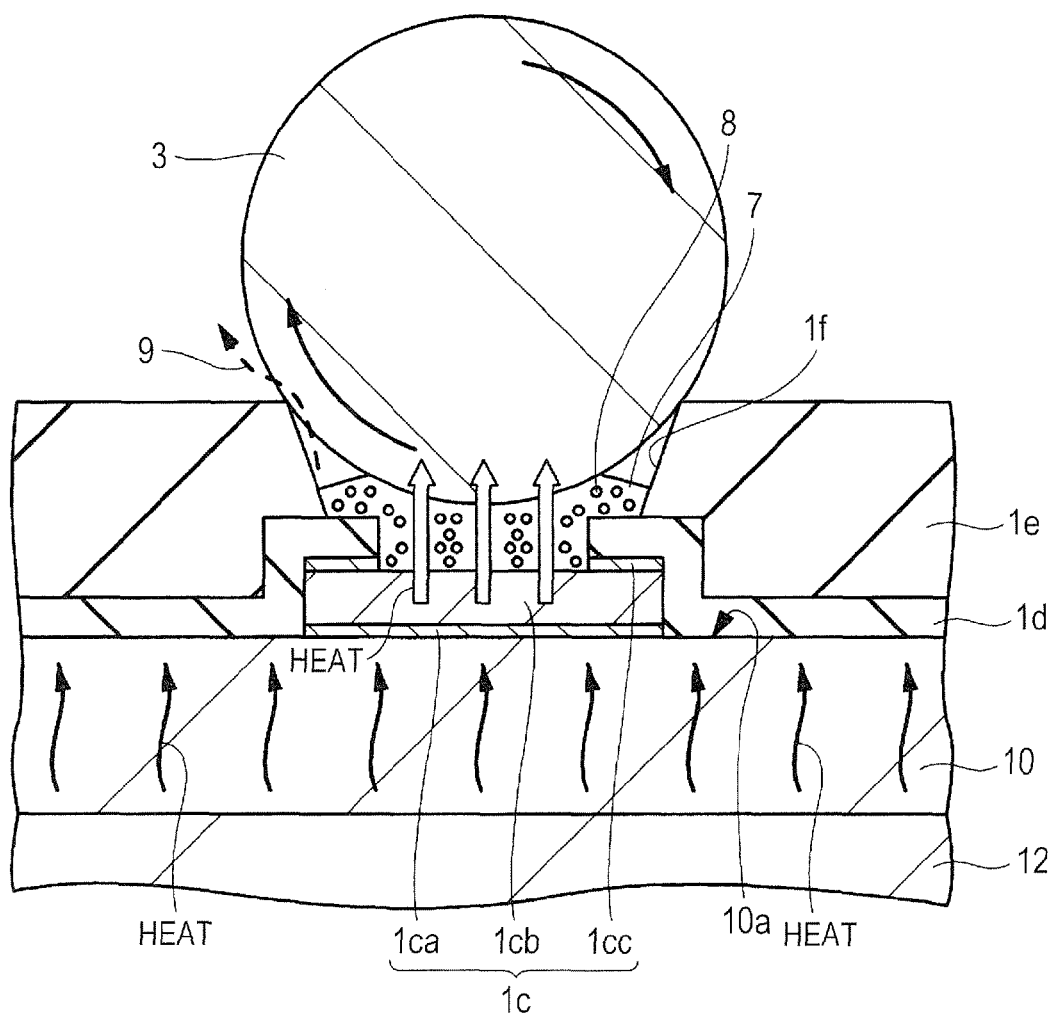
FIG. 10 is an enlarged partial plan view illustrating an example of a reflow state in the manufacturing of the semiconductor chip illustrated in FIG. 4.
Figure 11:
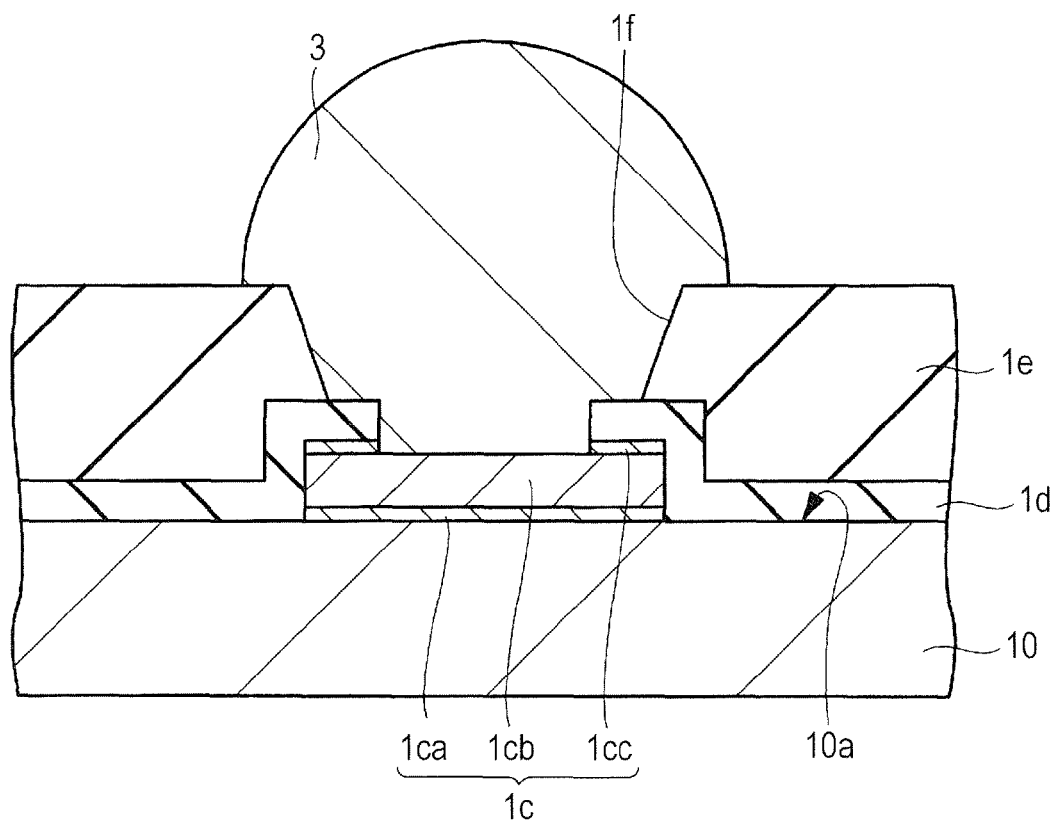
FIG. 11 is an enlarged partial plan view illustrating an example of a state in which the flux member is cleaned in the manufacturing of the semiconductor chip illustrated in FIG. 4.

FIG. 8 is an enlarged partial cross-sectional view illustrating an example of a state where a flux member is arranged in manufacturing of the semiconductor chip illustrated in FIG. 4. FIG. 9 is an enlarged partial cross-sectional view illustrating an example of a state where a solder ball is arranged in the manufacturing of the semiconductor chip illustrated in FIG. 4. FIG. 10 is an enlarged partial cross-sectional view illustrating an example of a reflow state in the manufacturing of the semiconductor chip illustrated in FIG. 4. FIG. 11 is an enlarged partial cross-sectional view illustrating an example of a state where the flux member is cleaned in the manufacturing of the semiconductor chip illustrated in FIG. 4.

1-2-1. Provision of Semiconductor Substrate (Semiconductor Wafer)

The semiconductor substrate (semiconductor wafer) 10 is provided, which includes a plurality of chip-forming regions (not illustrated) and is made of silicon (Si), for example, illustrated in FIG. 8. The electrode pads 1c are formed in the chip-forming regions of the semiconductor substrate 10, respectively. Further, the insulating film 1e in which the openings 1f exposing the respective electrode pad 1c are formed is provided over the upper surface 10a of the semiconductor substrate 10. More specifically, the insulating film 1d that is inorganic and covers a peripheral portion of an upper portion of each of the electrode pad 1c is formed on the upper surface 10a of the semiconductor substrate 10. Furthermore, the insulating film 1e that is organic is formed on the insulating film 1d. The opening 1f for exposing a center portion of the electrode pad 1c is formed in these insulating film 1d and 1e.

1-2-2. Arranging Flux Member

After the semiconductor substrate is provided, a flux member 7 illustrated in FIG. 8 is arranged. In the step of arranging the flux member 7, the flux member 7 including an conductive member is applied onto each of the electrode pads 1c of the semiconductor substrate 10. That is, the flux member 7 including the conductive member is arranged on the surface of the electrode pad 1c exposed through the opening 1f in the insulating films 1d and 1e. Note that the flux member 7 of the present embodiment includes the aforementioned conductive member. The aforementioned conductive member is conductive particles 8, and a material thereof is not specifically limited as long as that material is the conductive particles 8. One example of that material is tin (Sn).

Here, a mechanism that the electrode pad 1c of the semiconductor substrate 10 and the solder ball 3 hardly come into contact with each other, resulting in a bonding failure of the solder ball 3 is described.

As illustrated in FIGS. 5 and 6, the semiconductor chip 1 has the insulating film 1e formed over the upper surface 10a of the semiconductor substrate 10. The insulating film 1e has the opening 1f formed therein that exposes a portion of the electrode pad 1c. The size (width) of this opening if becomes smaller these days in association with miniaturization of the semiconductor chip 1 or increase of the number of pins (reduction of a pin pitch).

When the width of the opening 1f exposing the electrode pad 1c becomes smaller, the solder ball 3 arranged on the electrode pad 1c cannot go down sufficiently because the solder ball 3 comes into contact with the edge of the opening 1f of the insulating film 1e. Consequently, the distance between the solder ball 3 and the surface of the electrode pad 1c becomes larger, causing the bonding failure. That is, the reason why the solder ball 3 arranged on the electrode pad 1c does not come into direct contact with the electrode pad 1c is because the thickness of the insulating film 1e formed over the electrode pad 1c has an adverse effect.

It can be also considered to make the diameter of the solder ball 3 smaller in association with miniaturization of the opening 1f. However, when the diameter of the solder ball 3 is made smaller, the height of the solder ball 3 cannot be ensured sufficiently, and therefore the gap (the height) between the semiconductor chip 1 and the wiring board 2 cannot be ensured sufficiently. As a result, it is impossible to fill the gap between the semiconductor chip 1 and the wiring board 2 with the sealing member 4 for underfill sufficiently.

Because of the above, it is also impossible to reduce the diameter of the solder ball 3, resulting in the bonding failure of the solder ball 3.

Therefore, in the present embodiment, the conductive member is included in the flux member 7 to be applied onto the electrode pad 1c. This enables an alloy layer formed between plating formed on the surface of the electrode pad 1c (for example, a Ni—Au plating film) and the solder material of the solder ball 3 to grow easily, when the flux member 7 and the solder ball 3 are heated in a reflow step described later.

Consequently, the strength of bonding between the electrode pad 1c and the solder ball 3 can be increased, so that reliability of the semiconductor device can be improved.

Also, because the flux member 7 includes the conductive member, it is possible to improve heat transfer to the solder ball 3 during heating. This accelerates a reaction between the aforementioned plating and the solder material of the solder ball 3, so that it is possible to form the alloy layer at an interface between the electrode pad 1c and the solder ball 3. Consequently, the strength of bonding between the electrode pad 1c and the solder ball 3 can be increased. This can improve the reliability of the semiconductor device (BGA 6).

The conductive member is preferably conductive particles 8 made of tin (Sn), because the solder ball 3 uses tin (Sn)-based solder material in many cases.

However, the conductive particles 8 included in the flux member 7 may be particles of two kinds of elements, for example, tin (Sn) and silver (Ag), and tin (Sn) and copper (Cu). Further, it is more preferable that the conductive particles 8 included in the flux member 7 include three-element type conductive particles 8. In this case, three kinds of elements are tin (Sn), silver (Ag), and copper (Cu), for example. Alternatively, palladium (Pd) or the like may be further added to tin (Sn), silver (Ag), and copper (Cu), for example. That is, it suffices that the number of kinds of elements in the conductive particles 8 included in the flux material 7 is at least one, but the number of kinds of elements may be two or three or more.

The element of the conductive member included in the flux member 7 is preferably at least one kind of element used in the solder ball 3. An example of such an element is tin. However, the element of the conductive member may be an element other than tin.

The diameter of the conductive particles 8 is 10 μm or less, for example, but may be larger than 10 μm.

In addition, it is preferable that a melting point of the aforementioned conductive member (conductive particles 8) is the same or lower than a melting point of the solder material fainting the solder ball 3 that will be described later. That is, as the melting point is lower, the conductive member (conductive particles 8) melts more rapidly. Therefore, it is possible to improve heat transfer to the solder ball 3.

1-2-3. Arranging Balls

After the flux member 7 is arranged, the solder balls 3 (the conductive members having an approximately spherical shape) are arranged as illustrated in FIG. 9. In the step of arranging the balls, the solder balls 3 are arranged (supplied) over the respective electrode pads 1c via the flux members 7. At this time, the solder balls 3 arranged on the electrode pads 1c are fixed (temporarily fixed) by the flux members 7, respectively.

The solder balls 3 are formed of alloy of three kinds of elements, for example. The three kinds of elements are tin (Sn), silver (Ag), and copper (Cu), for example. However, the solder balls 3 may be a two-element type including two kinds of elements, which is Sn—Ag, Sn—Cu, or the like.

As the solder balls 3, the alloy of three kinds of elements is more preferable because the alloy of three kinds of elements is superior to the alloy of two kinds of elements with regard to the strength, heat resistance, and a lifetime of the balls themselves. Further, as the alloy includes more kinds of elements, the melting point of alloy becomes lower, so that an efficiency of heat transfer is increased and the strength of bonding with the electrode pad 1c is also increased. Therefore, it is preferable to use alloy of three or more kinds of elements as the solder balls 3.

Here, it is preferable to arrange the solder balls 3 by a ball feeding method. That is, the solder material preformed to have a ball shape (the solder ball 3) is sucked and carried above the electrode pad 1c by means of a suction jig, for example, and suction is released above the electrode pad 1c, so that the solder ball 3 is arranged on each electrode pad 1c.

As the method of arranging the balls of the solder material, a method may be employed which rolls the solder ball 3 on a mask (not illustrated) arranged on the semiconductor substrate 10 so that the solder ball 3 is arranged on a predetermined electrode pad 1c. That is, a method may be employed in which, on a mask with a plurality of through holes formed therein to correspond to the respective positions of the electrode pads 1c, the solder balls 3 are rolled from the end of the mask to be arranged in the through holes, respectively, so that the solder balls 3 are arranged on the respective electrode pads 1c.

Further, in place of arranging the balls of the solder material on the respective electrode pads 1c, the solder material may be supplied (applied) onto each electrode pad 1c by printing. Also in this case, it is preferable to use the alloy of three or more kinds of elements as the solder material.

In the present embodiment, the width of the opening 1f in the insulating film 1e is smaller than the diameter of the solder ball 3. Specifically, as illustrated in FIG. 9, the width D1 of the opening 1f that is square in a plan view (see FIG. 7) is smaller than the diameter D2 of the solder ball 3 (D1<D2). That is, in the present embodiment, the solder ball 3 having the diameter D2 larger than the width D1 of the opening 1f in the insulating film 1e is used.

1-2-4. Reflow

After the solder balls 3 are arranged, the solder balls 3 are heated to be bonded to the electrode pads 1c, respectively. In this reflow step, a case is described as an example, in which the semiconductor substrate 10 is arranged on a stage 12 having a heat source as illustrated in FIG. 10, and the solder balls 3 are heated in this state. Before being heated, the solder balls 3 are arranged on the flux members 7 and are not in contact with the electrode pads 1c, respectively. In other words, the solder balls 3 are respectively arranged over the electrode pads 1c via the flux members 7.

In this reflow step, first, the semiconductor substrate 10 is arranged on the stage 12 having the heat source, and the solder balls 3 are heated via the flux members 7 by the heat source. That is, heat is transferred from the electrode pads 1c to the solder balls 3 via the flux members 7. More specifically, the solder balls 3 are heated by the heat source via the flux members 7 only from the lower side of the electrode pads 1c, so that the solder balls 3 are caused to melt. A portion of the deformed solder ball 3 comes into contact with the electrode pad 1c, and metal forming the solder ball 3 and metal forming the electrode pad 1c are combined to each other, so that an alloy layer is formed at the interface between the solder ball 3 and the electrode pad 1c. In this manner, a plurality of solder balls 3 are bonded to a plurality of electrode pads 1c, respectively.

In detail, after the heat from the heat source is transferred to the semiconductor substrate 10, the multilayer wiring layer that is not illustrated, and the electrode pad 1c formed on the surface of the semiconductor substrate 10 via the stage 12, the heat is transferred to the solder ball 3 via the conductive particles 8 (e.g., tin (Sn)) 8 included in the flux member 7. In this manner, the solder ball 3 melts and is deformed, and the flux member 7 is caused to volatilize by heat. Due to volatilization of the flux member 7 by the heat, a gas 9 generated from the flux member 7 escapes from between the insulating film (a final protection film, an organic insulating film) 1e and the solder ball 3. At this time, the solder ball 3 rotates on the flux member 7, so that the surface of the solder ball 3 is coated by the flux member 7. Due to the coating of the flux material 7 on the solder ball 3, an oxide film formed on the surface of the solder ball 3 is removed.

In the present embodiment, in the semiconductor chip 1 and the solder ball 3, the width D1 of the opening 1f of the insulating film 1e that is square in a plan view (see FIG. 7)

is smaller than the diameter D2 of the solder ball 3 (or the width of the solder ball 3 in a cross-sectional view) (D1<D2), as illustrated in FIG. 9. Therefore, at a time when the solder ball 3 has been arranged over the electrode pad 1c, the solder ball 3 and the electrode pad 1c are not in direct contact with each other. Further, in a stage prior to heating, the opening 1f of the insulating film 1e is closed by the solder ball 3 above each of the electrode pads 1c. Furthermore, on the stage 12, the solder ball 3 is heated only by heat from the lower side of the electrode pad 1c via the flux member 7.

In this situation, even when heat is supplied only from the lower side of the electrode pad 1c to cause the solder ball 3 to melt, growth of an alloy layer hardly occurs between plating formed on the surface of the electrode pad 1c (e.g., a Ni—Au plating film) and the solder ball 3 in a state where the solder ball 3 is not contact with the electrode pad 1c. Therefore, it is not possible to obtain the strength of bonding of the solder ball 3 sufficiently, and the solder ball 3 can be caused to peel off easily.

Further, because the solder ball 3 closes the opening 1f in the insulating film 1e above the electrode pad 1c as described above, it is hard for the gas 9 generated from the flux member 7 to escape. When the gas 9 does not escape completely, the gas 9 staying below the solder ball 3 prevents the solder ball 3 and the conductive particles 8 from coming into contact with each other. Therefore, heat is hardly transferred to the solder ball 3. Consequently, the solder ball 3 hardly melts, resulting in a bonding failure of the solder ball 3.

However, the flux member 7 of the present embodiment includes the conductive particles (e.g., tin (Sn) 8. Therefore, it is possible to make growth of the alloy layer (e.g., an alloy layer of Sn—Ag and Ni) easier at the interface between the solder ball 3 and the aforementioned plating.

As a result, the strength of bonding between the solder ball 3 and the electrode pad 1c can be increased.

Furthermore, because the flux member 7 includes the conductive particles 8, heat transfer to the solder ball 3 can be also improved. More specifically, heat generated from the heat source of the stage 12 can be transferred to the solder ball 3 arranged over the electrode pad 1c via the flux member 7, that is, the solder ball 3 that is not in direct contact with the electrode pad 1c, via the semiconductor substrate 10 (the semiconductor chip 1), the electrode pad 1c, and the conductive particles 8 included in the flux member 7. Due to this, a reaction between the aforementioned plating and the solder ball 3 is accelerated, so that the growth of the aforementioned alloy layer is further accelerated. As a result, the strength of bonding between the solder ball 3 and the electrode pad 1c can be improved, as with the above.

As the method of heating the solder balls 3, a method of carrying the semiconductor substrate 10 with the solder balls 3 mounted thereon into a heating furnace (a reflow furnace) may be used. In this case, the electrode pads 1c and the solder balls 3 are heated from both the upper and lower sides. However, because the solder balls 3 and the electrode pads 1c are not in direct contact with each other and the openings 1f in the insulating film 1e are closed by the solder balls 3, respectively, the flux member 7 cannot escape completely.

Because the flux member 7 of the present embodiment includes the conductive particles 8, it is possible to make the growth of the alloy layer easier at the interface between the solder ball 3 and the aforementioned plating. Further, heat transfer to the solder ball 3 can be improved. As a result, the strength of bonding between the solder ball 3 and the electrode pad 1c can be improved.

As a modified example of the method of heating the solder ball 3, the reflow step may be performed multiple times. This can accelerate the growth of the aforementioned alloy layer at the interface between the solder ball 3 and the aforementioned plating, so that the strength of bonding between the solder ball 3 and the electrode pad 1c can be increased. Further, a time of reflow in the reflow step may be made longer. This can accelerate the growth of the aforementioned alloy layer at the interface between the solder ball 3 and the aforementioned plating as with the above, so that the strength of bonding between the solder ball 3 and the electrode pad 1c can be increased.

As described above, it is possible to bond the electrode pad 1c and the solder ball 3 to each other with the increased strength of bonding, as illustrate in FIG. 11.

1-2-5. Cleaning

After completion of the reflow, cleaning is performed. In this cleaning step, flux cleaning is performed for the solder ball 3 and a bonded portion thereof illustrated in FIG. 11.

1-2-6. Separation

After the flux cleaning, the semiconductor substrate 10 with the solder balls 3 provided thereon is separated into the semiconductor chips 1 by dicing, for example. Thus, a plurality of semiconductor chips 1 are acquired.

2. Die Bonding

After acquisition of the semiconductor chips, the semiconductor chip 1 is mounted over the wiring board 2 as illustrated in FIG. 3. In this die bonding step, the semiconductor chip 1 is mounted by flip-chip bonding. First, the semiconductor chip 1 is arranged over the upper surface 2a of the wiring board 2. In this arrangement, positions of the electrode pads 1c on the semiconductor chip 1 and positions of the terminals (bonding leads) 2aa on the wiring board 2 are aligned with each other. In other words, the semiconductor chip 1 with the solder balls 3 formed on the respective electrode pads 1c is arranged over the upper surface 2a of the wiring board 2 via the solder balls 3 in such a manner that the principal surface 1a of this semiconductor chip 1 faces the upper surface 2a of the wiring board 2.

Thereafter, chip bonding is performed. In this bonding, a downward load and heat are applied to the back surface 1b of the semiconductor chip 1 to bring the solder balls 3 into contact with the terminals 2aa of the wiring board 2 and to cause the solder balls 3 to melt, thereby electrically coupling the solder balls 3 and the terminals 2aa with each other, respectively. That is, flip-chip bonding is performed.

3. Sealing

After the die bonding, sealing is performed. In this sealing step, while the lower surface 2b of the wiring board 2 faces up, the sealing member (underfill resin) 4 is supplied (injected) into a gap between the semiconductor chip 1 and the wiring board 2 through a through hole formed in the wiring board 2 from the lower-surface 2b side of the wiring board 2 (from above). In this manner, the sealing member 4 is filled between the semiconductor chip 1 and the wiring board 2.

Supply of the sealing member 4 to the gap between the semiconductor chip 1 and the wiring board 2 may be performed by dropping the sealing member 4 around the semiconductor chip 1 from above the semiconductor chip 1 so that the sealing member 4 is filled into the gap between the semiconductor chip 1 and the wiring board 2.

4. Formation of External Terminals

After the sealing, the external terminals 5 are formed. In this external-terminal formation step, the external terminal (solder members (solder balls)) 5 are formed on the terminals (lands) 2ba on the lower surface 2b of the wiring board 2, respectively.

The external terminal 5 coupled to each terminal 2ba is not limited to a ball-shaped solder member, but may be coating of the solder material on the surface of each terminal 2ba or a plating film (a plating layer) formed on the surface of each terminal 2b. In this case, the semiconductor device is an LGA (Land Grid Array).

With the above step, assembly of the BGA (semiconductor device) 6 illustrated in FIGS. 1 to 3 is completed.

5. Advantageous Effects

According to a method of manufacturing a semiconductor device of the present embodiment, a conductive member is included in the flux member 7 that is applied onto the electrode pad 1c. Therefore, it is possible to make an alloy layer formed at an interface between the solder ball 3 and plating formed on the surface of the electrode pad 1c grow easily. Further, because of inclusion of the conductive member in the flux member 7, it is possible to transfer heat generated on the lower side of the electrode pad 1c to the solder ball 3 via the flux member 7 arranged (supplied) on this electrode pad 1c. As a result, the strength of bonding between the solder ball 3 and the electrode pad 1c can be increased.

This can improve reliability of the semiconductor device (BGA 6).

The conductive material included in the flux member 7 is the conductive particles 8, and preferably includes conductive particles 8 of three kinds of elements including tin (Sn), silver (Ag), and copper (Cu), for example. Alternatively, palladium (Pd) or the like may be added to tin (Sn), silver (Ag), and copper (Cu), for example. This can further increase a heat transfer efficiency, because the melting point of the alloy layer becomes lower as the kinds of included elements are more. In addition, the strength of bonding between the solder ball 3 and the electrode pad 1c can be further improved.

Consequently, it is possible to further improve the reliability of the semiconductor device (BGA 6).

Further, in the semiconductor chip 1 of the present embodiment, the thickness T1 of a portion of the insulating film 1e, which covers (overlaps) a peripheral portion of the electrode pad 1c, is thicker, as compared with the thickness T2 of the electrode pad 1c, as illustrated in FIG. 9. As the thickness T1 of the insulating film 1e is thicker, a step amount (that is, an aspect ratio) with respect to the electrode pad 1c in the opening 1f in the insulating film 1f is also larger.

In the semiconductor chip 1 having a structure in which the amount of a step between the insulating film 1e and the electrode pad 1c is large, the solder ball 3 hardly comes into contact with the electrode pad 1c when being arranged over the electrode pad 1c. Therefore, a bonding failure of the solder ball 3 to the electrode pad 1c can easily occur.

However, as in the method manufacturing of the semiconductor device of the present embodiment, inclusion of the conductive member (the conductive particles 8) in the flux member 7 enables the alloy layer formed at the interface between the solder ball 3 and the electrode pad 1c to grow easily even when the step amount between the insulating film 1e and the electrode pad 1c is large. Therefore, the strength of bonding between the solder ball 3 and the electrode pad 1c can be increased, so that the reliability of the semiconductor device (BCA 6) can be improved.

Modified Example

In the above description, the invention made by the inventors of the present application has been specifically described by way of the embodiment. However, the present invention is not limited to the aforementioned embodiments, and can be changed in various ways within the scope not departing from the gist thereof.

First Modified Example

Figure 12:
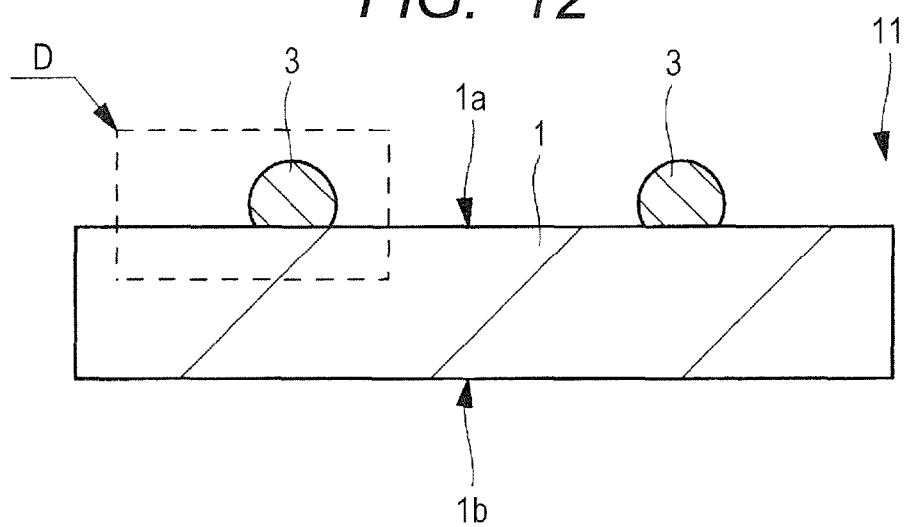
FIG. 12 is a cross-sectional view illustrating an example of a structure of a semiconductor device according to a first modified example of the embodiment.
Figure 13:
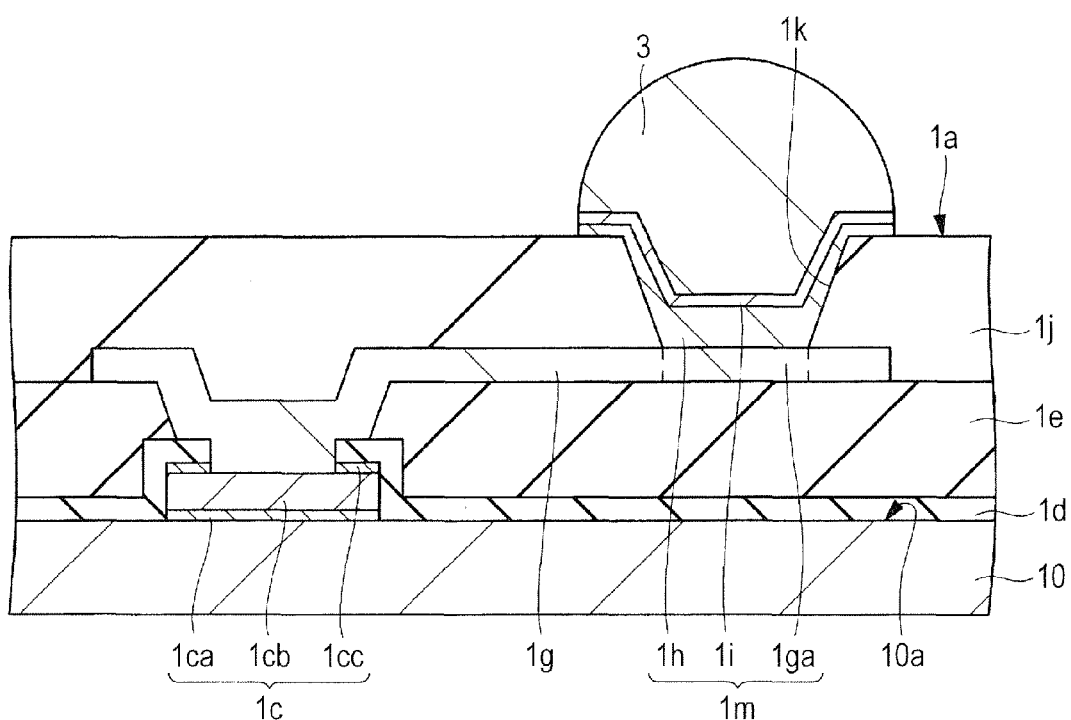
FIG. 13 is an enlarged partial cross-sectional view illustrating a structure of a D portion illustrated in FIG. 12.
Figure 14:
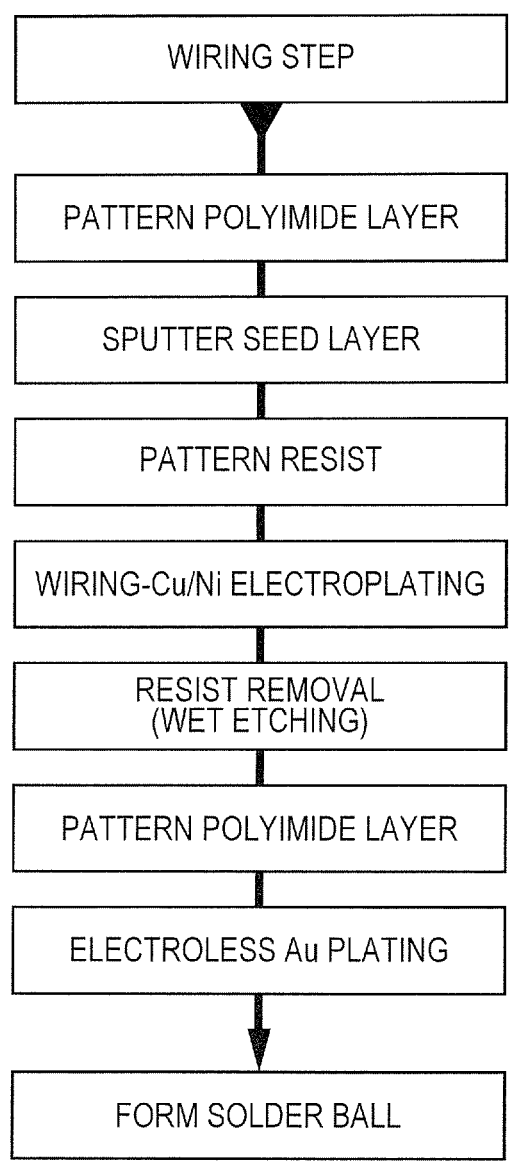
FIG. 14 is a flowchart illustrating an example of an assembling procedure of the semiconductor device illustrated in FIG. 12.

FIG. 12 is a cross-sectional view illustrating an example of a structure of a semiconductor device according to a first modified example of the embodiment. FIG. 13 is an enlarged partial cross-sectional view illustrating a structure of a D portion illustrated in FIG. 12. FIG. 14 is a flowchart illustrating an example of an assembly procedure of the semiconductor device illustrated in FIG. 12.

The semiconductor device illustrated in FIGS. 12 and 13 is a small semiconductor package called a wafer process package 11, having approximately the same size as a chip size.

The wafer process package 11 includes a semiconductor chip 1 provided with a semiconductor circuit and a plurality of electrode pads 1c electrically coupled to the semiconductor circuit, a rearranging wiring (a wiring portion) 1g coupled to each of the electrode pads 1c, conductive layers 1h and 1i formed over a portion (a portion exposed from an insulating film 1j) 1ga of the rearranging wiring 1g, and a solder ball 3 mounted over the portion 1ga of the rearranging wiring 1g via these conductive layers 1h and 1i. In this first modified example, the portion 1ga of the rearranging wiring 1g and the conductive layers 1h and 1i are collectively described as an electrode pad (a rearranged pad) 1m. The rearranging wiring 1g is for changing an arranged position of each of the electrode pads 1c to a different position (rearranging each of the electrode pads 1c), and is also called a rewiring. The rearranging wiring 1g is drawn out from each of the electrode pads 1c in this example.

The rearranging wiring 1g has a three-layer structure, for example, and is configured by a chromium (Cr) layer, a cupper (Cu) layer, and a nickel (Ni) layer in an order from the lowermost layer to the uppermost layer, for example. Among materials forming the electrode pad 1m to which the solder ball 3 is bonded, the conductive layer 1i as the uppermost layer is gold (Au) plating 1i, for example. Further, the solder ball 3 as an external terminal of the wafer process package 11 is mounted on the electrode pad 1m formed by the portion 1ga of the rearranging wiring 1g and the conductive layers 1h and 1i.

As an upper layer of each rearranging wiring 1g, the insulating film 1j is formed by a polyimide film or the like. The conductive layers 1h and 1i are formed on the surface of the portion 1ga of the rearranging wiring 1g that is exposed through an opening 1k of this insulating film 1j, and the solder ball 3 is bonded to the surface of the insulating layer 1i located as the uppermost layer.

Next, a method of manufacturing the wafer process package 11 illustrated in FIG. 13 is described based on the flowchart illustrated in FIG. 14.

First, the insulating film 1e that has an opening above the electrode pad 1c is formed by patterning a polyimide layer. After the insulating film 1e is famed, a seed layer of a chromium (Cr) layer, for example, is formed by sputtering on the electrode pad 1c and the insulating film 1e. After the seed layer is formed, a resist film is formed on the insulating film 1e by resist patterning.

After the resist film is formed, a copper (Cu) layer and a nickel (Ni) layer serving as a barrier layer are famed on the aforementioned seed layer that has been formed to be coupled to the electrode pad 1c, by wiring-Cu/Ni electroplating. In this manner, the rearranging wiring (the wiring portion) 1g coupled to the electrode pad 1c is formed.

After the rearranging wiring 1g is formed, the resist film is removed by resist removal (wet etching). After removal of the resist film, the insulating film 1j made of a polyimide layer or the like with the opening 1k provided above the rearranging wiring 1g is formed by patterning a polyimide layer. This patterning is performed in such a manner that a portion of the rearranging wiring 1g is exposed through the opening 1k.

After formation of the insulating film, the conductive layers 1h and 1i are formed at least in the opening 1k to be electrically coupled to the rearranging wiring 1g. Thus, a structure is obtained in which the electrode pad 1c is rearranged via the rearranging wiring 1g to a portion where the electrode pad 1m is formed. The conductive layers 1h and 1i are formed by electroless gold (Au) plating, for example. After the conductive layer 1i is famed, the solder ball 3 is arranged on the conductive layer 1i, and is then caused to melt by heat, so that the solder ball 3 (the external terminal) 3 is formed over the portion 1ga of the rearranging wiring 1g.

After formation of the solder ball, dicing is performed, so that individual wafer process packages 11 are completed.

In the step of forming the solder ball in the manufacturing steps of the wafer process package 11, the same processes as those from the flux member arranging step in FIG. 8 to the reflow step in FIG. 10 in the assembly of the BGA 6 of the aforementioned embodiment. In this manner, the solder ball 3 is mounted on the electrode pad (the rearranged pad) 1m.

In this manner, in manufacturing of the wafer process package 11, it is possible to make an alloy layer famed at an interface between the solder ball 3 and the plating (the gold plating 1i) formed on the surface of the electrode pad 1m grow easily because the conductive member is included in the flux member 7 when the solder ball 3 is mounted. Further, because of inclusion of the conductive member in the flux member 7, heat transfer to the solder ball 3 can be also improved. As a result, the strength of bonding between the solder ball 3 and the electrode pad 1m can be increased.

Therefore, reliability of the semiconductor device (the wafer process package 11) can be improved.

In addition, in the semiconductor chip 1 of the wafer process package 11, the thickness of the insulating film 1j formed on the rearranging wiring 1g is thicker, as compared with the thickness of the electrode pad 1m to which the semiconductor ball 3 is bonded. Therefore, the step amount with respect to the electrode pad 1m in the opening 1k in the insulating film 1j also becomes larger.

In the semiconductor chip 1 in which the step amount with respect to the electrode pad 1m is large, the electrode pad 1m and the solder ball 3 are in contact with each other only at a portion (a small area) of the conductive layer 1i. Therefore, heat generated from the stage 12 located below the semiconductor substrate 10 can be more easily transferred to the solder ball 3 from the electrode pad (the rearranged pad) 1m side as compared with the structure of the electrode pad 1c (for example, FIG. 6) described in the above embodiment. However, this structure is insufficient with regard to surely melting the solder ball 3 and to be bonded to the electrode pad (the rearranging pad) 1m, and a bonding failure of the solder ball 3 can easily occur.

Therefore, the conductive member (the conductive particles 8) is included in the flux member 7 in this first modified example. This structure transfers heat from the electrode pad 1m to the solder ball 3 via the conductive member (the conductive particles 8). Therefore, it is possible to transfer the heat more easily to the solder ball 3. Thus, even when the step amount between the insulating film 1j and the electrode pad 1m is large, the strength of bonding between the solder ball 3 and the electrode pad 1m can be increased, so that the reliability of the semiconductor device (the wafer process package 11) can be improved.

In the wafer process package 11, in a case where a nickel (Ni) layer is formed as the barrier layer in the rearranging wiring 1g, "performing the reflow step multiple times", which is described a modified example of the method of heating the solder ball 3 in the assembly of the BGA 6, is less effective because tin (Sn) constituting the solder ball 3 is diffused into this barrier layer and the thickness of the barrier layer is reduced. In other words, when tin (Sn) is diffused into the barrier layer and the barrier layer becomes thinner, pad strength and pad reliability are lowered. Therefore, in the case of the wafer process package 11 including the Ni barrier layer, "performing the reflow step multiple times" is less effective.

Second Modified Example

In this second modified example, a structure is described in which a wafer process package 11 does not rearrange the position of the electrode pad 1c by means of the rearranging wiring. That is, this second modified example is directed to a case of the wafer process package 11 in which the electrode pad 1m is formed directly above the electrode pad 1c by using the method of forming the rearranging wiring.

Also in a manufacturing step of the wafer process package 11 in which the electrode pad 1m is formed directly above the electrode pad 1c, the same processes as those from the flux member arranging step in FIG. 8 to the reflow step in FIG. 10 in the assembly of the BGA 6 in the above embodiment are performed, thereby mounting the solder ball 3 on the electrode pad 1m.

Due to this configuration, also in the manufacturing of the wafer process package 11 in which the electrode pad 1m is formed directly above the electrode pad 1c, it is possible to make an alloy layer formed at an interface between the solder ball 3 and plating (gold plating 1i) formed on the surface of the electrode pad 1m grow easily, because the conductive member is included in the flux member 7 when the solder ball 3 is mounted. Further, because of inclusion of the conductive member in the flux member 7, heat transfer to the solder ball 3 can be improved. Thus, the bonding strength between the solder ball 3 and the electrode pad 1m can be increased. Consequently, the reliability of the semiconductor device (the wafer process package 11 in which the electrode pad 1m is formed directly above the electrode pad 1c) can be improved.

In the case where, in the wafer process package 11 in which the electrode pad 1m is formed directly above the electrode pad 1c, the nickel (Ni) layer is formed as the barrier layer on the electrode pad 1m, "performing the reflow step multiple times", which is described a modified example of the method of heating the solder ball 3, is less effective. This is because tin (Sn) constituting the solder ball 3 is diffused into the barrier layer and the thickness of the barrier layer is reduced. In other words, when tin (Sn) is diffused into the barrier layer and the barrier layer becomes thinner, pad strength and pad reliability are lowered. Therefore, in the case of the wafer process package 11 including the Ni barrier layer, "performing the reflow step multiple times" is less effective.

Third Modified Example

In the above embodiment, a case is described in which the sealing step is performed after flip-chip bonding. That is, the case is described in which the sealing member (the underfill resin 4) is filled between the semiconductor chip 1 and the wiring board 2 after flip-chip bonding.

However, the sealing may be performed in such a manner that the sealing member 4, such as a film-like resin sheet member, is arranged on the wiring board 2 in advance before flip-chip bonding and, when flip-chip bonding is performed, the semiconductor chip 1 is arranged on the resin sheet member and heat is then applied to the resin sheet member via the semiconductor chip 1 to harden the resin sheet member and achieve the sealing between the semiconductor chip 1 and the wiring board 2. That is, the sealing may be achieved by applying the resin in advance.

Fourth Modified Example

In the above embodiment, a case where the conductive member included in the flux member 7 is tin (Sn) as an example is described. However, the conductive member (the conductive particles 8) included in the flux member 7 is not limited to tin (Sn). Because an conductive member (conductive particles 8) having a lower melting point than that of the solder ball 3 can melt earlier than the solder ball 3, the conductive member (conductive particles 8) of an element other than tin (Sn) or a plurality of elements may be used.

Fifth Modified Example

In the structure on the electrode pad $1c$ illustrated in FIG. 6 described in the above embodiment, when the aspect ratio in the cross-sectional shape of the opening $1f$ in the insulating film (the protection film, organic material (for example, a polyimide film) $1e$ satisfies $D1<T1$ where $D1$ is the width of the opening $1f$ in the insulating film $1e$ and $T1$ is the thickness (depth) of the insulating film $1e$, that is, when the depth $T1$ is larger than the width $D1$ of the opening $1f$, inclusion of the conductive member in the flux member 7 is more effective. In other words, in the cross-sectional shape of the opening $1f$ in the insulating film $1e$, when the thickness $T1$ of a portion of the insulating film $1e$, which covers the peripheral portion of each of the electrode pads $1c$, is larger than the width $D1$ of the opening $1f$ in the insulating film $1e$ above each of the electrode pads $1c$, the depth $T1$ of the opening $1f$ in the insulating film $1e$ is deeper, as compared with the opening width.

In this pad structure, it is more difficult for the solder ball 3 to come into contact with the surface of the electrode pad $1c$. Therefore, inclusion of the conductive member in the flux member 7 as in the above embodiment enables an alloy layer formed at an interface between the solder ball 3 and the electrode pad $1c$ to grow more easily. As a result, the strength of bonding between the solder ball 3 and the electrode pad $1c$ can be increased, so that the reliability of the semiconductor device can be improved.

When the aforementioned aspect ratio in the cross-sectional shape of the opening $1f$ in the insulating film $1e$ is considered, it can be also considered as measures against a bonding failure of the solder ball 3, to make the thickness $T1$ of the insulating film $1e$, in particular, the portion covering the peripheral portion of the electrode pad $1c$ thinner. However, when the thickness $T1$ of the insulating film $1e$ is made excessively thin (for example, is made thinner than the thickness $T2$ of the electrode pad $1c$), the function as the protection film (for example, a force holding the electrode pad $1c$) may be lowered. Therefore, it is not effective to make the thickness $T1$ of the insulating film $1e$ thinner.

Further, also in a case where the thickness $T1$ of the portion of the insulating film $1e$ formed by a polyimide film or the like, which covers (overlaps) the peripheral portion of the electrode pad $1c$, is larger than the thickness $T2$ of the electrode pad $1c$ as described in the above embodiment, inclusion of the conductive member in the flux member 7 as in the above embodiment enables the alloy layer formed at the interface between the solder ball 3 and the electrode pad $1c$ to grow more easily. As a result, the strength of bonding between the solder ball 3 and the electrode pad $1c$ can be increased, so that the reliability of the semiconductor device can be improved.

Sixth Modified Example

In the above embodiment, a case is described in which the shape of the opening $1f$ in the insulating film $1e$ above the electrode pad $1c$ is square in a plan view, as illustrated in FIG. 7. However, the shape of the opening $1f$ in a plan view may be a rectangle other than a square or a regular octagon, for example. In a case where the shape of the opening $1f$ in a plan view is the rectangle, the opening width in a direction along its short side is compared with the diameter of the solder ball 3.

Seventh Modified Example

Further, the modified examples can be applied in combination within the scope not departing from the gist of a technical idea described in the above embodiment.

What is claimed is:

1. A method of manufacturing a semiconductor device, comprising the steps of:
    (a) providing a semiconductor substrate including an electrode pad and an insulating film in which an opening that exposes the electrode pad is formed;
    (b) after the step (a), arranging a flux member having conductive material over a surface of the electrode pad exposed through the opening;
    (c) after the step (b), arranging a solder ball over the electrode pad via the flux member; and
    (d) after the step (c), melting the solder ball and bonding the solder ball to the electrode pad, the melting including transferring heat from the electrode pad to the solder ball via the conductive material included in the flux member,
    wherein, in a cross-section view, a width of the opening of the insulating film is smaller than a width of the solder ball, and
    wherein, in the step (d), the solder ball is rotated on the flux member.

2. The method of manufacturing the semiconductor device according to claim 1,
    wherein the conductive material includes conductive particles of three or more kinds of elements.

3. The method of manufacturing the semiconductor device according to claim 1,
    wherein a melting point of the conductive material is the same or lower than a melting point of a solder material forming the solder ball.

4. The method of manufacturing the semiconductor device according to claim 1,
    wherein, in the step (d), the semiconductor substrate is arranged over a stage having a heat source, and the solder ball is heated by the heat source.

5. The method of manufacturing the semiconductor device according to claim 1, wherein, in the step (d), the solder ball is heated by making the semiconductor substrate pass through a reflow furnace.

6. The method of manufacturing the semiconductor device according to claim 1,
   wherein a thickness of a portion of the insulating film, which covers a peripheral portion of each of a plurality of the electrode pads, is thicker than a thickness of each of the electrode pads.

7. The method of manufacturing the semiconductor device according to claim 1,
   wherein a thickness of a portion of the insulating film, which covers a peripheral portion of each of a plurality of the electrode pads, is larger than a width of the opening of the insulating film above each of the electrode pads.

8. The method of manufacturing the semiconductor device according to claim 1,
   wherein a plating is formed over a surface of each of a plurality of the electrode pads.

9. The method of manufacturing the semiconductor device according to claim 1,
   wherein a wiring portion is coupled to the electrode pad, and
   wherein the solder ball is mounted over the wiring portion.

10. The method of manufacturing the semiconductor device according to claim 9,
    wherein a thickness of the insulating film formed over the wiring portion as an upper layer is thicker than a thickness of the electrode pad.

* * * * *